United States Patent
Moschiano et al.

(10) Patent No.: US 9,779,817 B2
(45) Date of Patent: Oct. 3, 2017

(54) BOOSTING CHANNELS OF MEMORY CELLS TO REDUCE PROGRAM DISTURB

(71) Applicant: MICRON TECHNOLOGY, INC., Boise, ID (US)

(72) Inventors: Violante Moschiano, Avezzano (IT); Akira Goda, Boise, ID (US); Mason A. Jones, Seaford, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/740,685

(22) Filed: Jun. 16, 2015

(65) Prior Publication Data

US 2016/0372201 A1    Dec. 22, 2016

(51) Int. Cl.
| | | |
|---|---|---|
| G11C 16/04 | (2006.01) | |
| G11C 16/10 | (2006.01) | |
| G11C 16/34 | (2006.01) | |

(52) U.S. Cl.
CPC .......... *G11C 16/10* (2013.01); *G11C 16/0483* (2013.01); *G11C 16/3427* (2013.01)

(58) Field of Classification Search
CPC ............ G11C 16/0483; G11C 16/3422; G11C 16/3427; G11C 16/3418
See application file for complete search history.

(56) References Cited

U.S. PATENT DOCUMENTS

| | | | |
|---|---|---|---|
| 7,471,565 B2 | 12/2008 | Aritome | |
| 7,525,841 B2 | 4/2009 | Aritome | |
| 7,561,469 B2 | 7/2009 | Aritome | |
| 7,733,705 B2 | 6/2010 | Torsi et al. | |
| 7,738,291 B2 | 6/2010 | Aritome et al. | |
| 7,742,338 B2 | 6/2010 | Santin et al. | |
| 7,755,939 B2 | 7/2010 | Tamada | |
| 7,852,682 B2 * | 12/2010 | Byeon ................ | G11C 16/0483 365/185.18 |
| 8,009,478 B2 | 8/2011 | Ruby | |
| 8,355,278 B2 | 1/2013 | Sarin | |
| 8,767,487 B2 | 7/2014 | Goda et al. | |
| 9,368,222 B2 * | 6/2016 | Dunga ................ | G11C 16/24 |
| 2008/0008006 A1 | 1/2008 | Goda et al. | |
| 2011/0058424 A1 | 3/2011 | Goda et al. | |
| 2011/0194352 A1 | 8/2011 | Zhao et al. | |
| 2013/0258781 A1 | 10/2013 | Goda et al. | |
| 2014/0029345 A1 | 1/2014 | Goda et al. | |
| 2014/0063960 A1 | 3/2014 | Goda et al. | |

* cited by examiner

*Primary Examiner* — Andrew Q Tran
(74) *Attorney, Agent, or Firm* — Dicke, Billig & Czaja, PLLC (57) ABSTRACT

A method for programming a non-volatile memory device includes concurrently boosting channels of memory cells in a selected memory string and an unselected memory string of the memory device, discharging the boosted channels of the memory cells in the selected memory string, and programming a selected memory cell in the selected memory string after discharging the boosted channels in the selected memory string.

16 Claims, 8 Drawing Sheets

BOOSTING CHANNELS OF MEMORY CELLS TO REDUCE PROGRAM DISTURB

TECHNICAL FIELD

The present disclosure relates generally to memory and, in particular, in one or more embodiments, the present disclosure relates to boosting channel voltages in non-volatile memory devices.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, solid state drives and removable memory modules, and the uses are growing.

Power consumption is often an important consideration in the design and usage of memory devices. Speed of memory access can be another important consideration in the design and usage of memory devices.

For the reasons stated above, and for other reasons stated below which will become apparent to those skilled in the art upon reading and understanding the present specification, there is a need in the art for alternative methods of operating memory, and apparatus to perform such methods.

DETAILED DESCRIPTION

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

As NAND flash memory is scaled, parasitic capacitance coupling between the selected word line and adjacent word lines becomes problematic. Because of the parasitic coupling, cells can experience program disturb. The program disturb condition has two operational types: boosting and $V_{pass}$. During boosting, the cell's channel may be at a positive boosting voltage (e.g., 6V) with respect to the gate, and the gate may be at $V_{pgm}$ (e.g., 19V). During $V_{pass}$, the cell's channel may be at a reference potential, e.g., ground, and the gate may be at $V_{pass}$ (e.g., 10V). The cells on the selected word line and inhibited bit lines are generally influenced by boosting program disturb. Neighboring cells that are coupled to the enabled bit lines generally experience $V_{pass}$ program disturb.

Various embodiments described herein seek to reduce the likelihood of program disturb occurring by boosting the channel voltage of all memory cells in selected blocks, and then the boosted channel voltages of the memory cells to be programmed are discharged prior to these memory cells being programmed, while the channel voltages of inhibited memory cells remain at a boosted level during the programming.

Figure 1:
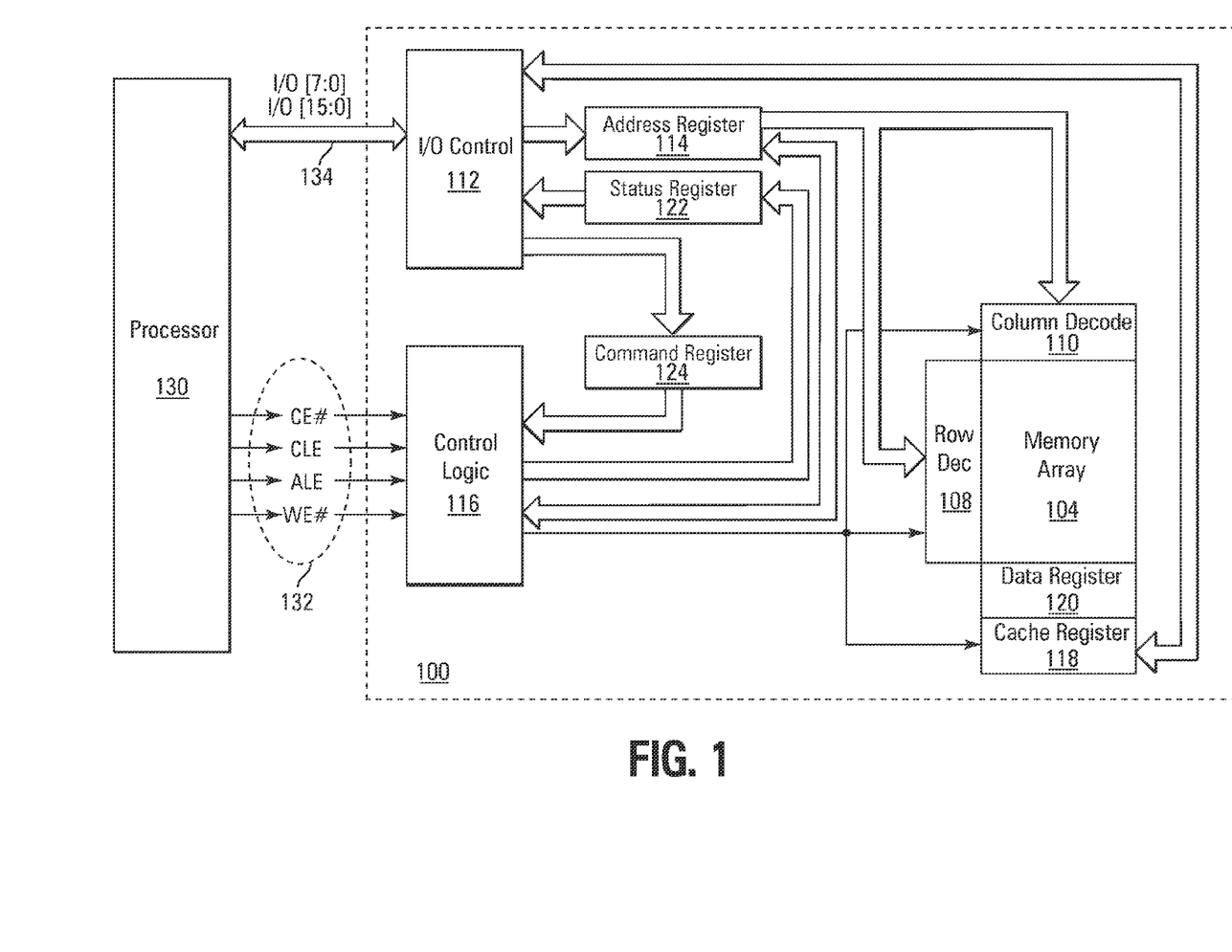
FIG. 1 is a simplified block diagram of a memory device in communication with a processor as part of an electronic system, according to an embodiment.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
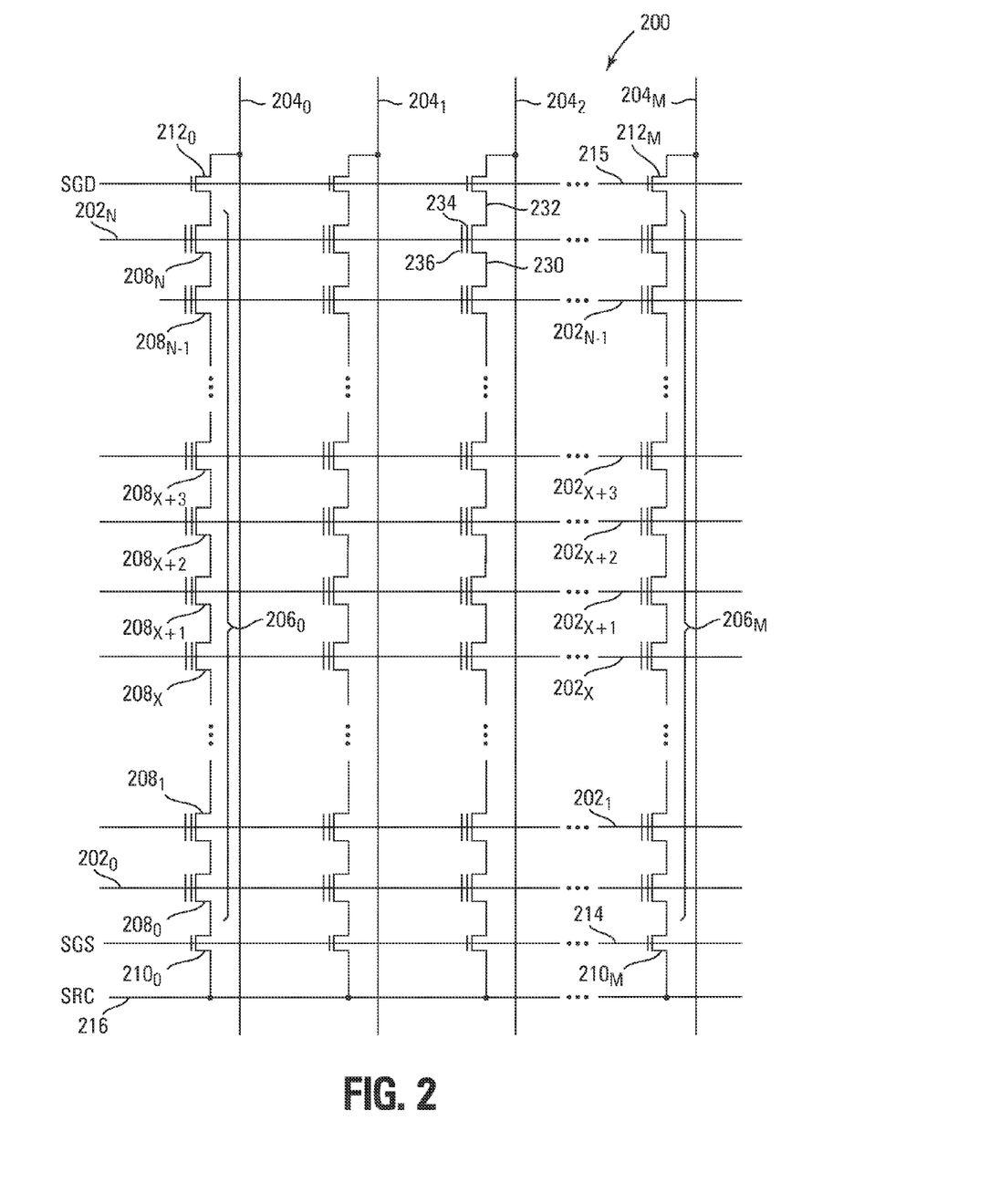
FIG. 2 is a schematic of a portion of an array of memory cells as could be used in a memory device of the type described with reference to FIG. 1.

FIG. 2 is a schematic of a NAND memory array 200, e.g., as a portion of array of memory cells 104. Memory array 200 includes access lines, such as word lines $202_0$ to $202_N$, and data lines, such as bit lines $204_0$ to $204_M$. The word lines 202 may be coupled to global access lines (e.g., global word lines), not shown in FIG. 2, in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2 might be a quasi-two-dimensional memory array and might have a generally planar structure, e.g., where the common source 216, strings 206 and bit lines 204 extend in substantially parallel planes. Alternatively, the memory array in FIG. 2 might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determines a data value of the cell (e.g., through changes in threshold voltage), and a control gate 236, as shown in FIG. 2. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Although the example of FIG. 2 is discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

A programming operation may be comprised of biasing the select gate source lines with a $V_{SGS}$ (e.g., 0V) that turns off the select gate source transistors. This turns off the series string discharge path through the select gate source transistors to the source line. A selected access line (e.g., word line) for flash memory cells being programmed is typically biased by programming pulses that start at a voltage of around 16V and may incrementally increase to more than 20V. The unselected word lines for the remaining cells may be biased at a pass voltage $V_{pass}$, which allows the unselected memory cells to act in a pass mode, i.e., these unselected memory cells are activated regardless of their stored data values. This is typically in an approximate range of 9-10V. The data lines (e.g., bit lines) of the cells to be programmed may be biased at a program enable voltage (e.g., 0V), while the other bit lines may be inhibited (e.g., biased at a supply voltage $V_{CC}$).

A program verify operation may be performed to determine if all of the memory cells on the selected word line have been adequately programmed. If the verify discovers that a memory cell has not been programmed to the desired threshold voltage, the programming voltage may be increased by a certain step voltage (e.g., 1V) and the selected word line may again be biased with this voltage. This repeats until all of the cells of the selected word line have been either programmed or flagged as defective.

Figure 3:
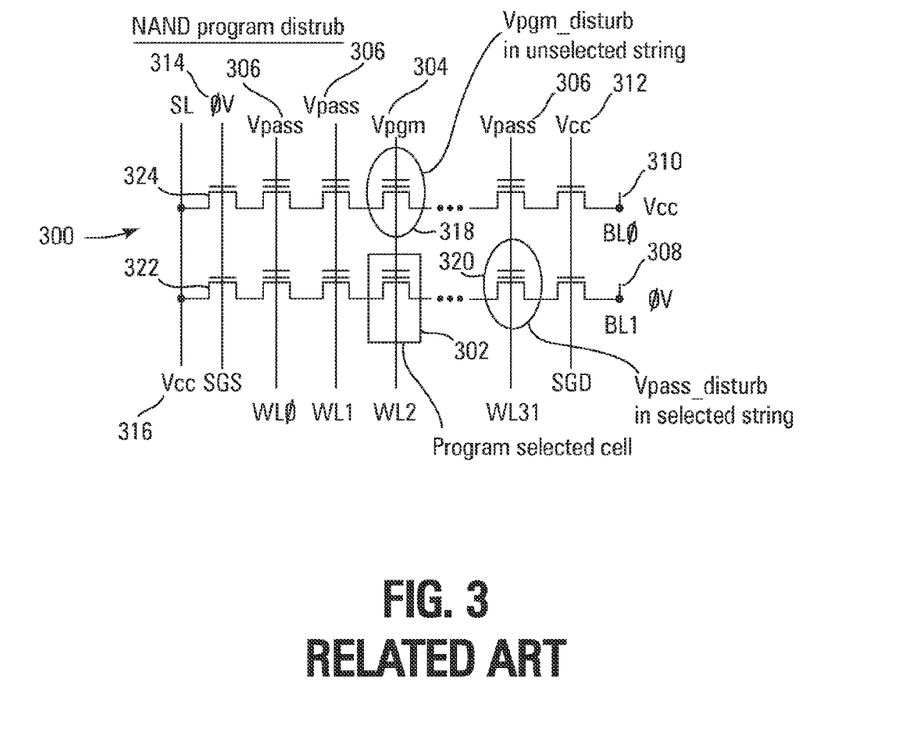
FIG. 3 shows a diagram of a NAND Flash memory array programming operation of the related art.

FIG. 3 shows a diagram of a NAND Flash memory array programming operation 300 of the related art. It is noted that the NAND programming operation described in FIG. 3 is for illustrative purposes and should not be taken as limiting. A programming voltage ($V_{pgm}$) 304, such as 20V, is coupled to a word line coupled to the gate of the memory cell 302 selected to be programmed. At substantially the same time (e.g., the same time), the word lines coupled to the gates of the unselected memory cells of the selected memory string 322 may also be driven by a pass gate voltage ($V_{pass}$) 306, such as 10V, so as to place them in a pass through mode unrestricted by their stored data values and to generate a boosted channel of carriers by capacitive coupling in the memory string 322 for the programming operation. The selected memory string 322 may then be coupled through select gate drain (SGD) 312, which is turned on, to a bit line (BL1) that has a program enable voltage 308 (e.g., 0V) placed upon it so that the channel of the selected string 322 is tied to the program enable voltage level of the bit line 308. This applies a field across the selected memory cell 302 that causes carriers to be injected into the floating gate or charge trapping layer, altering the threshold voltage level ($V_t$) of the cell 302 and storing the data value. During this operation, the selected memory string 322 may be isolated from the source line 316 by the select gate source (SGS) 314. The memory cells 318 of unselected memory strings 324 that are also coupled to the selected word line and the word line programming voltage, $V_{pgm}$, 304 are inhibited (e.g., prevented) from being programmed by having their select gate drain (SGD) transistor turned off, allowing their channels to float and to be boosted (e.g., to about 7V).

Program disturb can happen during a NAND programming operation, where charge is inadvertently injected into an unselected memory cell, altering its threshold voltage level or programming it. Two common types of program disturb are $V_{pgm}$-program disturb and $V_{pass}$-program disturb. In $V_{pgm}$-program disturb, memory cells 318 that are on adjacent memory cell strings 324 but are coupled to the selected word line carrying the elevated programming voltage, $V_{pgm}$, 304 can have an inadvertently large field applied across their channel and gate causing them to be disturbed. In $V_{pass}$-program disturb, memory cells 320 that are on the same memory string 322, but which are coupled to the pass voltage, $V_{pass}$, may inadvertently have a large field applied by a too high $V_{pass}$ voltage across their channel and gate and can be disturbed.

Various programming methods have been implemented to address program disturb. These programming methods include local self boost, modified local self boost, drain-side self boost, modified drain-side self boost, and source-side self boost. These methods generally perform channel boost for cells that are inhibited (e.g., cells in unselected memory strings), while the channel remains biased (not boosted) for cells to be programmed (e.g., selected cell 302 in selected string 322 shown in FIG. 3).

Figure 4:
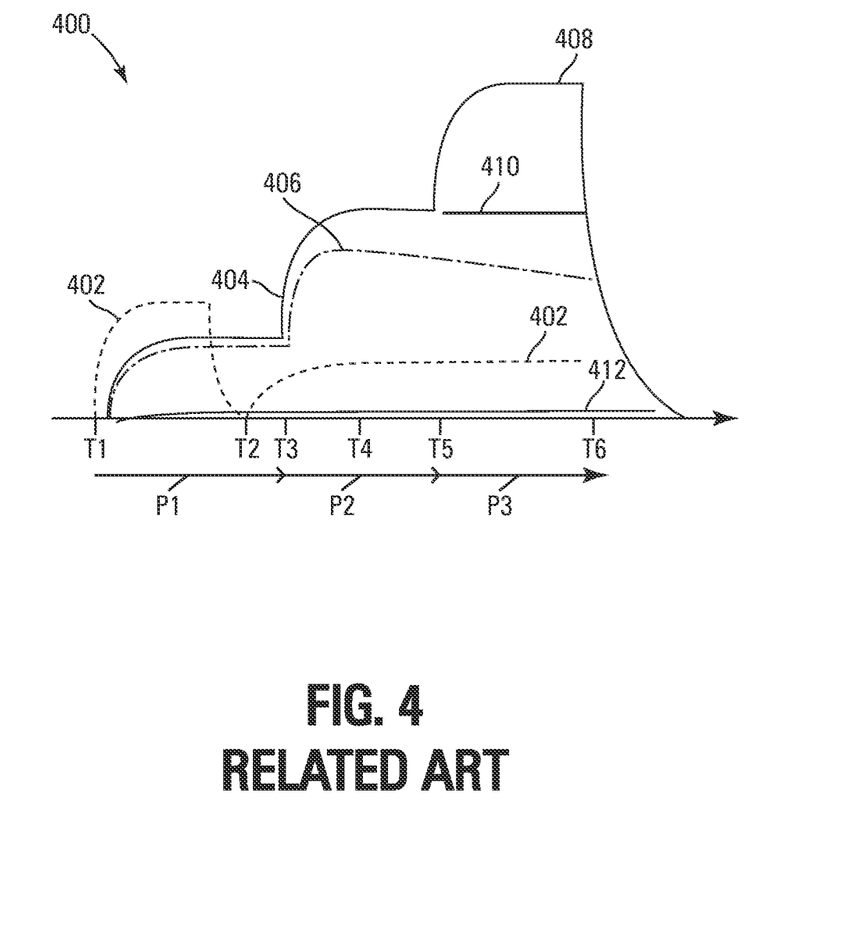
FIG. 4 illustrates waveforms developed in facilitating one or more biasing methods in which channel boost is performed for inhibited cells according to the related art.

FIG. 4 illustrates waveforms 400 developed in facilitating one or more biasing methods in which channel boost is performed only for inhibited cells according to the related art. Three phases P1, P2, and P3 of performing a programming operation are illustrated in FIG. 4. A pre-charge (e.g., seeding) phase P1 is performed from time T1 to time T3, which is followed by a pass phase P2 that is performed from time T3 to time T5, which is followed by a programming phase P3 that is performed from time T5 to time T6. The absolute magnitudes, relative magnitudes and/or durations (e.g., time) of the signals shown are not meant to be limiting, but are intended to be illustrative in describing one or more embodiments according to the present disclosure.

The waveforms shown in FIG. 4 are discussed by way of example of a programming operation performed on selected memory cells, such as memory cell 302 in FIG. 3. Waveform 402 represents an SGD signal, which might correspond to the SGD signal 312 shown in FIG. 3. Waveform 404 represents word line signals, which might correspond to one or more of the word line signals on word lines WL0-WL31 shown in FIG. 3. Waveform 404 eventually rises to a $V_{pass}$ level 410 for unselected word lines, and rises to a $V_{pgm}$ level 408 for a selected word line. Waveform 406 represents the channel voltage of memory cells being inhibited, which might correspond to the channel voltage of the memory cells in the unselected string 324 shown in FIG. 3. Waveform 412 represents the channel voltage of memory cells being programmed, which might correspond to the channel voltage of memory cell 302 in the selected string 322 shown in FIG. 3.

For the programming operation shown in FIG. 4, the data lines (e.g., bit lines) for the selected memory strings (e.g., selected memory string 322 shown in FIG. 3) are biased at a program enable voltage of 0V, and the data lines (e.g., bit lines) for the unselected memory strings (e.g., unselected memory string 324 shown in FIG. 3) are biased at a program inhibit voltage of $V_{CC}$. As shown in FIG. 4, between times T1 and T2, the SGD waveform 402 ramps up and then back down, and the word line waveform 404 and the channel voltage 406 of memory cells being inhibited both begin to ramp up. At time T2, the SGD waveform 402 again begins to ramp up, and eventually settles at a voltage that keeps the SGD transistor on for memory strings having a data line at 0V (e.g., selected memory string 322 shown in FIG. 3) and keeps the SGD transistor off for memory strings having a data line at $V_{CC}$ (e.g., unselected memory string 324 shown in FIG. 3). At time T3, the word line waveform 404 beings to ramp up to the $V_{pass}$ level 410, which results in the channel voltage 406 of memory cells being inhibited being boosted up to a boosted channel voltage. The final boosted channel voltage is determined by coupling ratio, leakage, gate-induced drain leakage (GIDL), and other effects. The SGD transistor of the memory cells being inhibited is off, which results in the channel voltage of these cells being boosted. In contrast, the SGD transistor of the memory cells being programmed is on, and the channel voltage 412 of these cells is not boosted. Rather, as shown in FIG. 4, the channel voltage 412 of the memory cells being programmed remains grounded throughout the programming operation.

Figure 5:
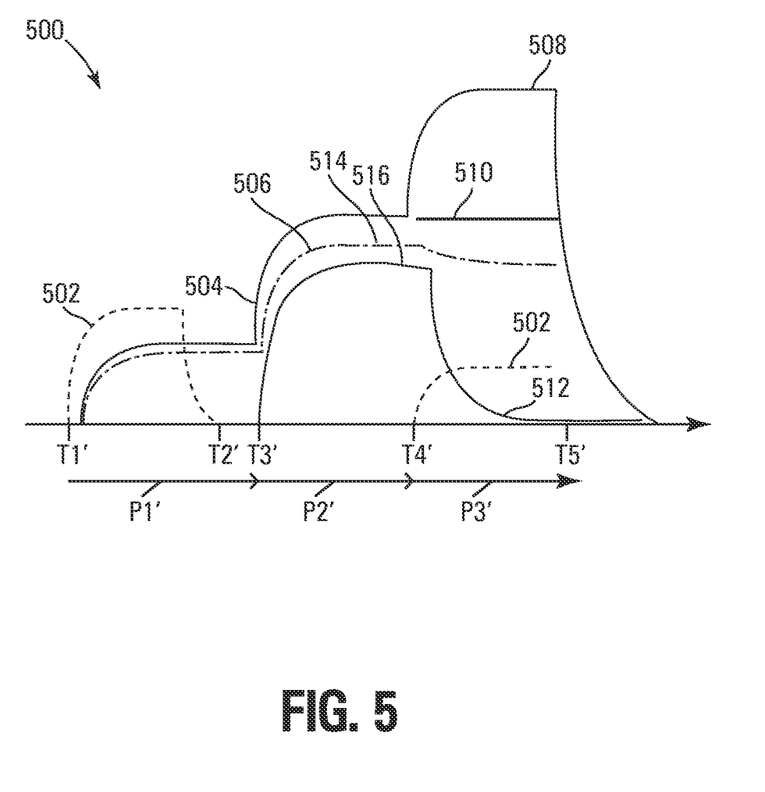
FIG. 5 illustrates waveforms developed in facilitating one or more biasing methods in which channel boost is performed for inhibited cells and cells to be programmed according to various embodiments of the present disclosure.

At about time T4, the boosted channel voltage 406 begins to decrease over time. At time T5, the word line waveform 404 for selected word lines begins to ramp up to the $V_{pgm}$ level 408 for programming the selected memory cells. The decrease of the channel voltage 406 over time can result in the programming of one or more of the memory cells being inhibited. FIG. 5 shows a biasing method that reduces the likelihood of inhibited memory cells being programmed.

FIG. 5 illustrates waveforms 500 developed in facilitating one or more biasing methods in which channel boost is performed for inhibited cells and cells to be programmed according to various embodiments of the present disclosure. Three phases P1', P2', and P3' of performing a programming operation are illustrated in FIG. 5. A pre-charge (e.g., seeding) phase P1' is performed from time T1' to time T3', which is followed by a pass phase P2' that is performed from time T3' to time T4', which is followed by a programming phase P3' that is performed from time T4' to time T5'. The absolute magnitudes, relative magnitudes and/or durations (e.g., time) of the signals shown are not meant to be limiting, but are intended to be illustrative in describing one or more embodiments according to the present disclosure.

The waveforms shown in FIG. 5 are discussed by way of example of a programming operation performed on selected memory cells, such as memory cell 302 in FIG. 3. Waveform 502 represents an SGD signal, which might correspond to the SGD signal 312 shown in FIG. 3. Waveform 504 represents word line signals, which might correspond to one or more of the word line signals on word lines WL0-WL31 shown in FIG. 3. Waveform 504 eventually rises to a $V_{pass}$ level 510 for unselected word lines, and rises to a $V_{pgm}$ level 508 for a selected word line. Waveform 506 represents the channel voltage of memory cells being inhibited, which might correspond to the channel voltage of the memory cells in the unselected string 324 shown in FIG. 3. Waveform 512 represents the channel voltage of memory cells being programmed, which might correspond to the channel voltage of memory cell 302 in the selected string 322 shown in FIG. 3.

For the programming operation shown in FIG. 5, the data lines (e.g., bit lines) for the selected memory strings (e.g., selected memory string 322 shown in FIG. 3) may be biased at a program enable voltage, e.g., 0V, and the data lines (e.g., bit lines) for the unselected memory strings (e.g., unselected memory string 324 shown in FIG. 3) may be biased at a program inhibit voltage of, e.g., $V_{CC}$. As shown in FIG. 5, between times T1' and T2', the SGD waveform 502 ramps up and then back down, and the word line waveform 504 and the channel voltage 506 of memory cells being inhibited both begin to ramp up. At time T2', the SGD waveform may be at a voltage, e.g., 0V, such that the SGD transistors for both selected and unselected memory strings are off.

At time T3', the word line waveform 504 beings to ramp up to the $V_{pass}$ level 510, which results in the channel voltage 506 of memory cells being inhibited being boosted up to a first boosted channel voltage 514, and also results in the channel voltage 512 of the memory cell being programmed being boosted up to a second boosted channel voltage 516. The final boosted channel voltages 514 and 516 are determined by coupling ratio, leakage, GIDL, and other effects. The SGD transistors of the memory cells being inhibited and the memory cells being programmed are off between times T3' and T4', which results in the channel voltage of all of these cells being boosted. The channel voltages 506 and 512 remain at the boosted levels 514 and 516, respectively, while the SGD transistors remain off.

At time T4', the word line waveform 504 for selected word lines begins to ramp up to the $V_{pgm}$ level 508 for programming the selected memory cells. Also at time T4', the SGD waveform 502 begins to ramp up, and eventually settles at a voltage that keeps the SGD transistor on for memory strings having a data line at the program enable voltage (e.g., selected memory string 322 shown in FIG. 3) and keeps the SGD transistor off for memory strings having a data line at the program inhibit voltage (e.g., unselected memory string 324 shown in FIG. 3). When the SGD transistors for selected memory strings turns on shortly after time T4', the channel voltage 512 of the memory cells to be programmed is driven toward the program enable voltage, as shown by the ramping down of the channel voltage 512 between times T4' and T5', which allows programming of the selected memory cells.

The SGD transistors remain off for unselected memory strings between times T4' and T5', and the channel voltage 506 for the unselected memory strings remains boosted during this time period, but gradually begins to decrease over time. The decrease of the channel voltage 506 over time can result in the programming of one or more of the memory cells being inhibited. However, the channel voltage 506 begins to decrease at a later point in time than the channel voltage 406 (shown in FIG. 4), so the channel voltage 506 may remain at a higher boosted level during the programming phase P3', which can reduce the likelihood of inhibited memory cells being programmed. When both selected and unselected memory strings are boosted, neighboring strings may be at or near the same potential, so there is little or no leakage between neighboring strings.

Figure 6:
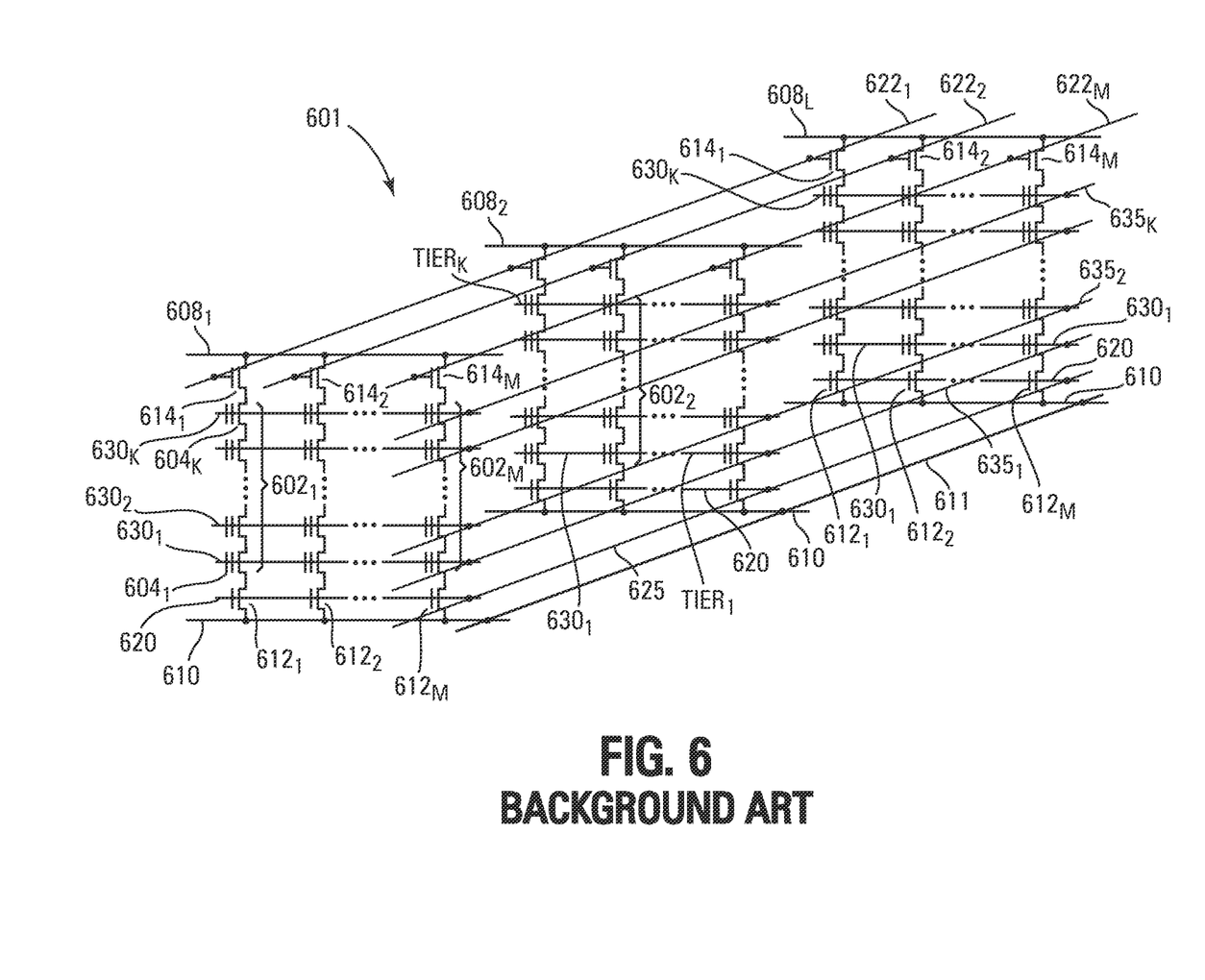
FIG. 6 illustrates a schematic representation of a memory block of a three-dimensional memory array of the background art.

Boosting techniques described herein are also applicable to three-dimensional memory arrays, such as a three-dimensional NAND architecture memory array. FIG. 6 illustrates a schematic representation of a memory block 601 of a three-dimensional memory array, according to the background art. Block 601 includes substantially vertical strings 602 (e.g., NAND strings) of series-coupled memory cells $604_1$ to $604_K$, e.g., non-volatile memory cells, that may be adjacent to substantially vertical semiconductor pillars. A semiconductor pillar may act as channel region for the string of memory cells adjacent thereto. That is, during operation of one or more memory cells 604 of a string 602, a channel can be formed in the corresponding semiconductor pillar.

The strings 602 may be each coupled between a data line, such as a bit line 608 (e.g., between one of bit lines $608_1$ to $608_L$), and a source 610. A plurality of strings 602 (e.g., strings $602_1$ to $602_M$) may be coupled to the same bit line 608 and the same source 610. The sources 610 may be commonly coupled to a common source 611.

For some embodiments, each memory cell location in a string may correspond to a tier within memory block 601. For example, memory cells $604_1$ to $604_K$ may be respectively located in tiers 1 to K, e.g., where tiers 1 to K are respectively located at different vertical locations within block 601.

One end of each string 602 may be selectively coupled to a source 610 through a select transistor, such as a source select transistor 612. For example, strings $602_1$ to $602_M$ may be selectively coupled to a source 610 through source select transistors $612_1$ to $612_M$. An opposite end of each string 602 may be selectively coupled to a bit line 608 through a select transistor, such as a drain select transistor 614. For example, strings $602_1$ to $602_M$ may be selectively coupled to a bit line 608 through drain select transistors $614_1$ to $614_M$.

The control gates of the source select transistors $612_1$ to $612_M$ selectively coupled to a single source 610 may be commonly coupled to a select line, such as a source select line 620. Source select lines 620 may be commonly coupled to a common source select line 625, e.g., a common source-select plate, which couples the control gates of all of the select transistors 612 in block 601 together.

Drain select lines $622_1$ to $622_M$ may be respectively commonly coupled to the control gates of drain select transistors $614_1$ to $614_M$. For example, drain select line $622_1$ may be commonly coupled to the control gates of the drain select transistors $614_1$ coupled to strings $602_1$, and drain select line $622_M$ may be commonly coupled to the control gates of the drain select transistors $614_M$ coupled to strings $602_M$. Note, however, that the control gates of the select transistors $614_1$ to $614_M$ that are coupled to a single bit line 608 are not coupled to each other.

The control gates of the memory cells $604_1$ to $604_K$ of each of the strings $602_1$ to $602_M$ selectively coupled to a single bit line 608 and a single source 610 may be commonly coupled to an access line, such as one of word lines $630_1$ to $630_K$. For example, the control gates of the memory cells $604_1$ of each of strings $602_1$ to $602_M$ may be commonly coupled to a word line $630_1$, and the control gates of the memory cells $604_K$ of each of strings $602_1$ to $602_M$ may be commonly coupled to a word line $630_K$. Word lines $630_1$ to $630_K$ may be respectively commonly coupled to common word lines $635_1$ to $635_K$, e.g., that may be referred to as common control-gate plates. For example, the control gates of all of the memory cells in a tier, such as any one of tiers 1 to K, may be merged (e.g., commonly coupled) to one control-gate plate.

Figure 7:
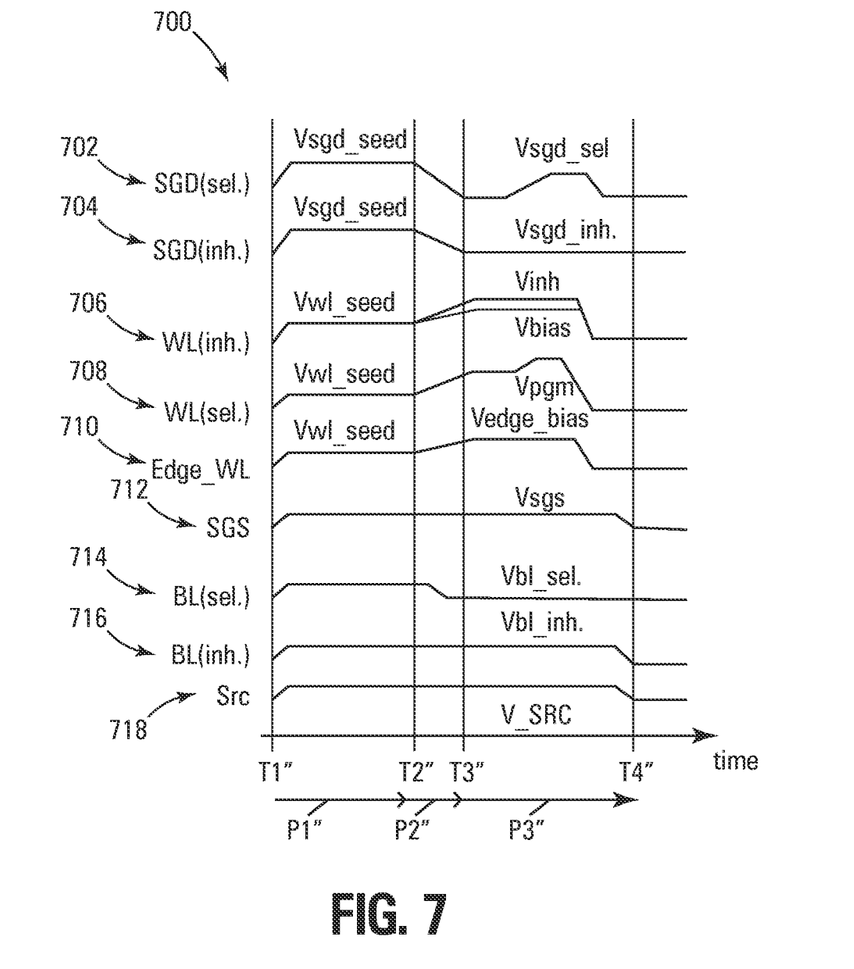
FIG. 7 illustrates waveforms developed in facilitating one or more biasing methods in which channel boost is performed for inhibited cells and cells to be programmed for a three-dimensional memory array according to various embodiments of the present disclosure.

FIG. 7 illustrates waveforms 700 developed in facilitating one or more biasing methods in which channel boost is performed for inhibited cells and cells to be programmed for a three-dimensional memory array according to various embodiments of the present disclosure. Three phases P1", P2", and P3" of performing a programming operation are illustrated in FIG. 7. A pre-charge (e.g., seeding) phase P1" is performed from time T1" to time T2", which is followed by a pass phase P2" that is performed from time T2" to time T3", which is followed by a programming phase P3" that is performed from time T3" to time T4". The absolute magnitudes, relative magnitudes and/or durations (e.g., time) of the signals shown are not meant to be limiting, but are intended to be illustrative in describing one or more embodiments according to the present disclosure.

The waveforms shown in FIG. 7 are discussed by way of example of a programming operation performed on selected memory cells, such as selected ones of the memory cells 604 in FIG. 6. Waveform 702 represents an SGD select signal, which might correspond to the SGD signal on selected ones of the drain select lines 622 shown in FIG. 6. Waveform 704 represents an SGD inhibit signal, which might correspond to the SGD signal on inhibited ones of the drain select lines 622 shown in FIG. 6. Waveform 706 represents word line signals for inhibited word lines, which might correspond to one or more of the word line signals on inhibited ones of the word lines 630 shown in FIG. 6. Waveform 708 represents word line signals for selected word lines, which might correspond to one or more of the word line signals on selected ones of the word lines 630 shown in FIG. 6. Waveform 710 represents word line signals for edge word lines, which might correspond to one or more of the word line signals on edge ones of the word lines 630 shown in FIG. 6. Waveform 712 represents an SGS signal, which might correspond to the signal on source select line 620 shown in FIG. 6. Waveform 714 represents bit line signals for selected bit lines, which might correspond to one or more of the bit line signals on selected ones of the bit lines 608 shown in FIG. 6. Waveform 716 represents bit line signals for inhibited bit lines, which might correspond to one or more of the bit line signals on inhibited ones of the bit lines 608 shown in FIG. 6. Waveform 718 represents an SRC signal, which might correspond to the signal on source line 610 shown in FIG. 6.

For the programming operation shown in FIG. 7, during the pre-charge phase P1", the SGD signals 702 and 704 may be biased at a Vsgd_seed voltage (e.g., 5V), and the word line signals 706, 708, and 710 may be biased at a Vwl_seed voltage (e.g., 2V). The SGS signal 712 may be biased at a Vsgs voltage (e.g., 0.5V) during the three phases P1" to P3". The source signal 718 may be biased at a V_SRC voltage (e.g., 2.3V) during the three phases P1" to P3". The bit line signal 716 for inhibited bit lines may be biased at a Vbl_inh voltage (e.g., 2.3V) during the three phases P1" to P3". The bit line signal 714 for selected bit lines may ramp down from a seed voltage during phase P2", and may be biased at a Vbl_sel voltage (e.g., 0V) during phase P3".

During phase P2", the SGD waveforms 702 and 704 may ramp down to a Vsgd_inh voltage (e.g., 0V), and the word line waveforms 706, 708, and 710 may ramp up. During phase P2", the channel voltage of memory cells being inhibited and memory cells being programmed may both begin to ramp up. At time T3", the SGD waveforms 702 and 704 may be at a voltage, e.g., 0V, such that the SGD transistors for both selected and unselected memory strings are off At about time T3", the word line waveform 706 for inhibited memory cells may be biased at a $V_{pass}$ voltage. The $V_{pass}$ voltage might be constant across all unselected word lines and/or the $V_{pass}$ voltage might change dependent upon various conditions, such as proximity of an unselected word line to a selected word line, for example. This is represented in FIG. 7 by the two $V_{pass}$ voltages of Vinh and Vbias. Also at time T3", the word line waveform 710 for edge word lines may be biased at a Vedge_bias voltage. At time T3", the channel voltage of memory cells being inhibited may be boosted up to a first boosted channel voltage, and the channel voltage of the memory cell being programmed may be boosted up to a second boosted channel voltage. The SGD transistors of the memory cells being inhibited and the memory cells being programmed may be off at time T3", which may result in the channel voltage of all of these cells being boosted. These channel voltages remain at the boosted levels while the SGD transistors remain off.

During phase P3", the word line waveform 708 for selected word lines may begin to ramp up to the $V_{pgm}$ level for programming the selected memory cells, and the SGD waveform 702 for selected memory cells may also begin to ramp up to a Vsgd_sel voltage (e.g., 2.5V) that keeps the SGD transistors on for selected memory strings. In an embodiment, the waveforms 702 and 708 may be ramped up concurrently during phase P3". When the SGD transistors for selected memory strings turn on shortly after time T3", the channel voltage of the memory cells to be programmed is driven toward the program enable voltage, which allows programming of the selected memory cells. The SGD signal 704 for inhibited memory strings may be biased at a Vsgd-inh voltage (e.g., 0V) during phase P3", and the SGD transistors may remain off for unselected memory strings during phase P3". The channel voltage for the unselected memory strings remains boosted during phase P3", which can reduce the likelihood of inhibited memory cells being programmed.

Figure 8:
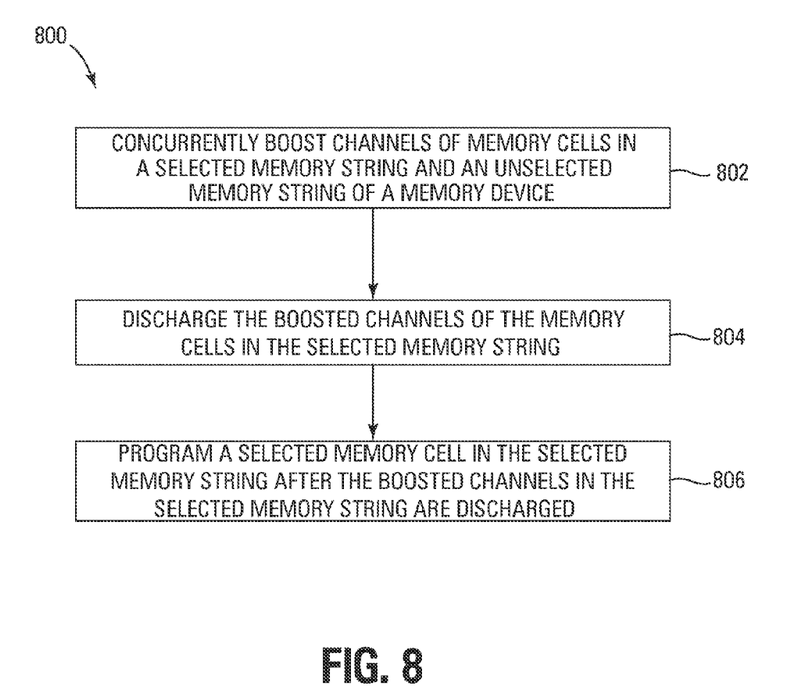
FIG. 8 is a flowchart of a method for programming a non-volatile memory device according to an embodiment.

FIG. 8 is a flowchart of a method 800 for programming a non-volatile memory device according to an embodiment. At 802, channels of memory cells in a selected memory string and an unselected memory string of the memory device are concurrently (e.g., simultaneously) boosted. As used herein, a first act and a second act occur concurrently when the first act occurs simultaneously with the second act for at least a portion of a duration of the second act. At 804, the boosted channels of the memory cells in the selected memory string are discharged. At 806, a selected memory cell in the selected memory string is programmed after the boosted channels in the selected memory string are discharged.

In an embodiment of method 800, the boosting of channels of memory cells in the selected memory string and the unselected memory string at 802 includes applying a first bias voltage to a control gate of a select transistor in the selected memory string and to a control gate of a select transistor in the unselected memory string, wherein the first bias voltage maintains the select transistors in an off state; and applying a pass voltage to access lines of the memory cells in the selected memory string and the unselected memory string while the select transistors are in the off state. In an embodiment, the discharging of the boosted channels at 804 includes applying a second bias voltage to the control gates of the select transistors in the selected memory string and the unselected memory string, wherein the second bias voltage causes the select transistor in the selected memory string to enter an on state to discharge the boosted channels in the selected memory string, and wherein the second bias voltage maintains the select transistor in the unselected memory string in the off state to maintain the boosted channels in the unselected memory string. In an embodiment, the select transistors in the selected and unselected memory strings are select gate drain (SGD) transistors. In an embodiment, programming the selected memory cell at 806 includes applying a program enable voltage to a data line of the selected memory string, applying a program voltage to an access line of the selected memory cell, and applying a program inhibit voltage to a data line of the unselected memory string, e.g., while maintaining the boosted channels of the memory cells in the unselected memory string.

Another embodiment is directed to a method of programming memory cells of a non-volatile NAND architecture memory array. The method includes applying a first bias voltage to a control gate of select transistors in selected and unselected NAND architecture memory strings, wherein the first bias voltage maintains the select transistors in an off state; applying a pass voltage to access lines of memory cells in the selected and unselected memory strings while the select transistors are in the off state to boost channels of the memory cells in the selected and unselected memory strings; discharging the boosted channels of the memory cells in the selected memory strings; and programming selected memory cells in the selected memory strings after discharging the boosted channels in the selected memory strings.

The discharging of the boosted channels according to an embodiment includes applying a second bias voltage to the control gates of the select transistors in the selected and unselected memory strings, wherein the second bias voltage causes the select transistors in the selected memory strings to enter an on state to discharge the boosted channels in the selected memory strings, and wherein the second bias voltage maintains the select transistors in the unselected memory strings in the off state to prevent discharge of the boosted channels in the unselected memory strings. In an embodiment, the select transistors in the selected and unselected memory strings are select gate drain (SGD) transistors. Programming the selected memory cells according an embodiment includes biasing a data line of the selected memory strings with a program enable voltage, biasing access lines of the selected memory cells with a program voltage, and biasing data lines of the unselected memory strings with a program inhibit voltage.

Another embodiment is directed to a method of operating a NAND architecture memory device. The method includes biasing select gate drain (SGD) transistors in selected and unselected NAND architecture memory strings to maintain the SGD transistors in an off state; biasing access lines of memory cells in the selected and unselected memory strings while the SGD transistors are in the off state to boost channels of the memory cells in the selected and unselected memory strings; biasing the SGD transistors in the selected memory strings to enter an on state to drive the boosted channels in the selected memory strings to ground while maintaining the boosted channels in the unselected memory strings; and programming selected memory cells in the selected memory strings after driving the boosted channels in the selected memory strings to ground. The method according to one embodiment further includes biasing data lines of the selected memory strings with a program enable voltage, biasing data lines of the unselected memory strings with a program inhibit voltage, and biasing access lines of the selected memory cells with a program voltage.

Another embodiment is directed to a memory device, which includes a memory array having a plurality of memory blocks, and a controller. The controller is adapted to program memory cells in a selected memory block of the memory array by: concurrently boosting channels in selected memory strings and unselected memory strings of the selected memory block; driving the boosted channels in the selected memory strings to a reference potential (e.g., ground) while maintaining the boosted channels in the unselected memory strings; and programming selected memory cells in the selected memory strings after driving the boosted channels in the selected memory strings to the reference potential. The memory device according to one embodiment is a NAND architecture memory device, and the memory array is a NAND architecture non-volatile memory array. In one embodiment, the memory device is a three-dimensional (3D) NAND architecture memory device.

The controller according to an embodiment is adapted to apply a first select gate drain (SGD) bias voltage to control gates of SGD devices in the selected and unselected memory strings, wherein the first SGD bias voltage maintains the SGD devices in an off state, and is adapted to apply a pass voltage to access lines of the memory cells in the selected and unselected memory strings while the SGD devices are in the off state. The controller is adapted to apply a second SGD bias voltage to the control gates of the SGD devices in the selected and unselected memory strings, wherein the second SGD bias voltage causes the SGD devices in the selected memory strings to enter an on state to discharge the boosted channels in the selected memory strings, and wherein the second SGD bias voltage maintains the SGD devices in the unselected memory strings in the off state to maintain the boosted channels in the unselected memory strings. The controller is adapted to apply a program enable voltage to data line of the selected memory strings, apply a program voltage to access lines of the selected memory cells, and apply a program inhibit voltage to data lines of the unselected memory strings.

Another embodiment is directed to a three-dimensional NAND architecture memory device, which includes a three-dimensional memory array having a plurality of memory blocks, and a controller. The controller is adapted to program memory cells in a selected memory block of the three-dimensional memory array by: biasing select transistors in selected and unselected NAND architecture memory strings to maintain the select transistors in an off state; biasing access lines of memory cells in the selected and unselected memory strings while the select transistors are in the off state to boost channels of the memory cells in the selected and unselected memory strings; biasing the select transistors in the selected memory strings to enter an on state to drive the boosted channels in the selected memory strings to a reference potential while maintaining the boosted channels in the unselected memory strings; and programming selected memory cells in the selected memory strings after driving the boosted channels in the selected memory strings to the reference potential. In an embodiment, the select transistors in the selected and unselected NAND architecture memory strings are select gate drain (SGD) transistors.

In an embodiment, the channel voltage of all memory cells in selected blocks are boosted, and then the boosted channel voltages of the memory cells to be programmed are discharged prior to these memory cells being programmed, while the channel voltages of inhibited memory cells remain at a boosted level during the programming.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method for programming a non-volatile memory device, comprising:
concurrently boosting channels of a first set of memory cells in a selected memory string and a second set of memory cells in an unselected memory string of the memory device, wherein boosting channels of the first set of memory cells in the selected memory string and the second set of memory cells in the unselected memory string comprises applying a first bias voltage to a control gate of a first select transistor in the selected memory string and to a control gate of a second select transistor in the unselected memory string, wherein the first bias voltage maintains the first and second select transistors in an off state;
discharging the boosted channels of the first set of memory cells in the selected memory string; and
programming a selected memory cell in the first set of memory cells in the selected memory string after discharging the boosted channels of the first set of memory cells in the selected memory string.

2. The method of claim 1, wherein boosting channels of the first set of memory cells in the selected memory string and the second set of memory cells in the unselected memory string further comprises:
applying a pass voltage to access lines of the first set of memory cells in the selected memory string and the second set of memory cells in the unselected memory string while the first and second select transistors are in the off state.

3. The method of claim 2, wherein discharging the boosted channels comprises:
applying a second bias voltage to the control gates of the first select transistor in the selected memory string and the second select transistor in the unselected memory string, wherein the second bias voltage causes the first select transistor in the selected memory string to enter an on state to discharge the boosted channels in the selected memory string.

4. The method of claim 3, wherein the second bias voltage maintains the second select transistor in the unselected memory string in the off state to maintain the boosted channels in the unselected memory string.

5. The method of claim 4, wherein the first and second select transistors are select gate drain (SGD) transistors.

6. The method of claim 1, wherein programming the selected memory cell comprises:
applying a program enable voltage to a first data line of the selected memory string; and
applying a programming voltage to an access line of the selected memory cell to increase a threshold voltage of the selected memory cell while the first data line is at the program enable voltage.

7. The method of claim 6, wherein programming the selected memory cell further comprises:
applying a program inhibit voltage to a second data line of the unselected memory string while the programming voltage is applied to the access line.

8. A method for programming a non-volatile memory device, comprising:
concurrently boosting channels of a first set of memory cells in a selected memory string and a second set of memory cells in an unselected memory string of the memory device by isolating the selected memory string and the unselected memory string from respective data lines and a source, and applying a pass voltage to access lines of the first set of memory cells in the selected memory string and the second set of memory cells in the unselected memory string while the selected memory string and the unselected memory string are isolated from their respective data lines and the source, wherein boosting channels of the first set of memory cells in the selected memory string and the second set of memory cells in the unselected memory string comprises maintaining a first select transistor in the selected memory string and a second select transistor in the unselected memory string in an off state while applying the pass voltage;
discharging the boosted channels of the first set of memory cells in the selected memory string; and
programming a selected memory cell in the first set of memory cells in the selected memory string after discharging the boosted channels of the first set of memory cells in the selected memory string.

9. The method of claim 8, wherein discharging the boosted channels comprises:
biasing the first select transistor in the selected memory string and the second select transistor in the unselected memory string to cause the first select transistor in the selected memory string to enter an on state and maintain the second select transistor in the unselected memory string in the off state.

10. The method of claim 9, wherein the biasing drives the boosted channels of the first set of memory cells in the selected memory string to ground while maintaining the boosted channels of the second set of memory cells in the unselected memory string.

11. The method of claim 8, wherein programming the selected memory cell comprises:
enabling for programming a first data line of the selected memory string;
inhibiting for programming a second data line of the unselected memory string; and
applying a program voltage to an access line of the selected memory cell.

12. A method for programming a non-volatile memory device, comprising:
concurrently boosting channels of a first set of memory cells in a selected memory string and a second set of memory cells in an unselected memory string of the memory device, wherein boosting channels of the first set of memory cells in the selected memory string and the second set of memory cells in the unselected memory string comprises biasing a first select gate drain (SGD) transistor in the selected memory string and a second SGD transistor in the unselected memory string to maintain the first and second SGD transistors in an off state;
discharging the boosted channels of the first set of memory cells in the selected memory string and maintaining the boosted channels of the second set of memory cells in the unselected memory string; and
programming a selected memory cell in the first set of memory cells in the selected memory string after discharging the boosted channels of the first set of memory cells in the selected memory string and while maintaining the boosted channels of the second set of memory cells in the unselected memory string.

13. The method of claim 12, wherein boosting channels of the first set of memory cells in the selected memory string and the second set of memory cells in the unselected memory string further comprises:
applying a pass voltage to access lines of the first set of memory cells in the selected memory string and the second set of memory cells in the unselected memory string while the first and second SGD transistors are in the off state.

14. The method of claim 13, wherein discharging the boosted channels comprises:
biasing the first SGD transistor in the selected memory string and the second SGD transistor in the unselected memory string to drive the boosted channels of the first set of memory cells in the selected memory string to ground.

15. The method of claim 12, wherein the non-volatile memory device is a NAND architecture memory device.

16. The method of claim 12, wherein the non-volatile memory device is a three-dimensional (3D) NAND architecture memory device.

* * * * *